(12) United States Patent
Yamaguchi (10) Patent No.: US 6,212,073 B1
(45) Date of Patent: Apr. 3, 2001

(54) HEAT SINK

(75) Inventor: Akio Yamaguchi, Nagoya (JP)

(73) Assignee: Kitagawa Industries Co., Inc., Nagoya (JP)

(*) Notice: Subject to any disclaimer, the term of this patent is extended or adjusted under 35 U.S.C. 154(b) by 0 days.

(21) Appl. No.: 09/420,115

(22) Filed: Oct. 18, 1999

(30) Foreign Application Priority Data

Oct. 19, 1998 (JP) .................................................. 10-296844

(51) Int. Cl.[7] .................................................. H05K 7/20
(52) U.S. Cl. .................. 361/705; 165/80.2; 165/80.4; 165/185; 174/16.3; 174/35 R; 361/708; 361/818; 428/40.5; 257/707
(58) Field of Search .................. 165/104.33, 80.2, 165/80.3, 185; 174/15.2, 16.3, 35 R; 257/707, 713, 715; 361/700, 699, 704, 705, 707, 708, 709–710, 717–718, 816, 818; 428/40.5

(56) References Cited

U.S. PATENT DOCUMENTS

| | | | | |
|---|---|---|---|---|
| 4,915,167 | * | 4/1990 | Altoz | 361/704 |
| 5,126,919 | * | 6/1992 | Yamamoto et al. | 361/699 |
| 6,046,907 | * | 4/2000 | Yamaguchi | 361/704 |
| 6,054,198 | * | 4/2000 | Bunyan et al. | 428/40.5 |

FOREIGN PATENT DOCUMENTS

| | | |
|---|---|---|
| 61-171153 | 8/1986 | (JP) . |
| 9-283976 | 10/1997 | (JP) . |

* cited by examiner

*Primary Examiner*—Gregory Thompson
(74) *Attorney, Agent, or Firm*—Davis & Bujold, P.L.L.C.

(57) ABSTRACT

An automatically mountable heat sink for effectively conducting and dissipating heat of an electronic part comprises a heat dissipation plate formed by bending a rectangular metal plate of aluminum, copper or the like by means of pressing along the lines perpendicular to its longitudinal direction and a phase changing member made of a mixture of paraffin and epoxy resin having alumina as a heat conductive filler dispersed therein and applied to a ceiling surface of the heat dissipation plate. When the heat sink and the electronic parts are soldered on a printed wiring board by heating of reflow soldering, the phase changing member made of the mixture of paraffin and epoxy resin is softened and partly moves downward by the action of gravity to abut the upper surface of the electronic part, then is solidified, thereby connecting the heat dissipation plate and the electronic part with each other.

12 Claims, 5 Drawing Sheets

HEAT SINK

TECHNICAL FIELD OF THE INVENTION

The invention relates to a heat sink for accelerating heat dissipation from a heat generator such as an electronic part and the like or a heated body heated by the heat generator.

BACKRGOUND OF THE INVENTION

Recently, electronic parts such as IC's and the like used for electronic devices have become more integrated and operated at higher clock speeds, which increases the electricity consumption and heat generation. This is one cause of misoperation of the electronic device and failure of the electronic parts themselves. Therefore, heat dissipation from the electronic parts is now a major concern.

Heretofore, there has been used a heat sink made of a metal plate with high heat conductivity, such as brass and the like, to suppress temperature rise of an electronic part during use of an electronic device and the like. The heat sink conducts the heat generated from the electronic part and dissipates it from its surfaces by the temperature difference between the surface and the outside atmosphere. Some kinds of such heat sinks can be automatically mounted with electronic parts.

Figure 4A:
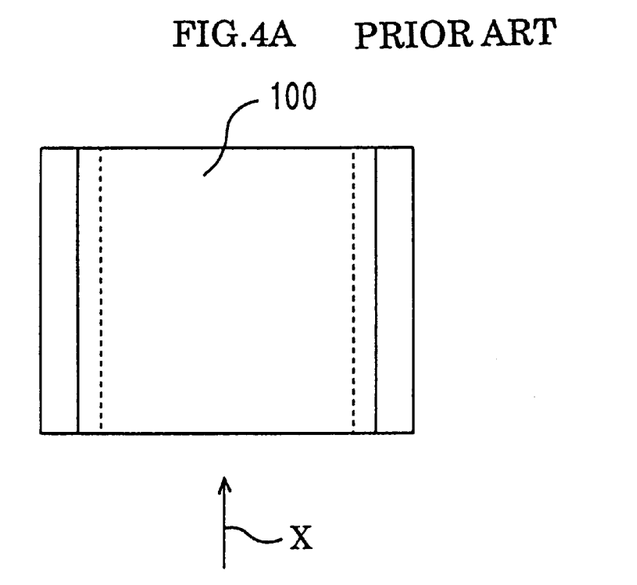
FIGS. 4A, 4B and 4C are a plan view, a side view and another side view, respectively, of a conventional heat sink.
Figure 4B:
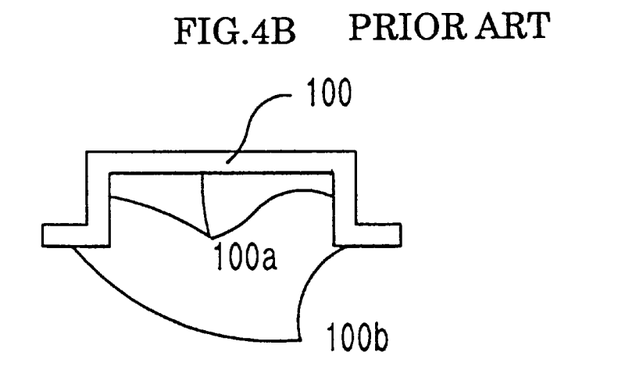

For example, a heat sink 100 as shown in FIGS. 4A and 4B has been used heretofore. FIG. 4A is a plan view of the heat sink 100 and FIG. 4B is its side view taken in the direction of the arrow X in FIG. 4A.

Figure 4C:
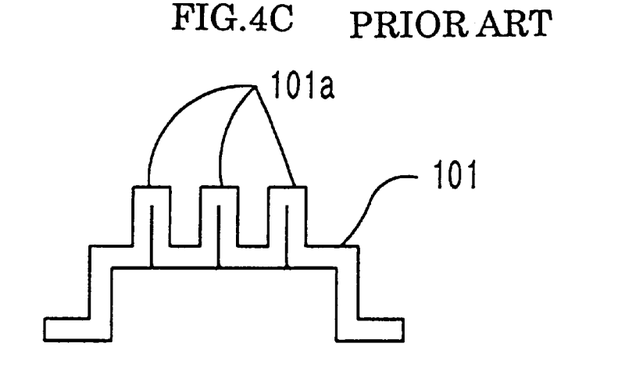

The heat sink 100 is made by bending a rectangular metal plate along lines perpendicular to its longitudinal direction. Specifically, a metal plate is bent into a U-shaped form in the cross section, and both longitudinal ends of the metal plate are perpendicularly bent toward outside of the U-shaped form. Both perpendicularly bent end surfaces 100b which adjoin an inside surface 100a of the U-shape are soldered to a printed wiring board in such a way that the inside surface 100a of the U-shape faces the printed wiring board. To widen the contact area with the outside atmosphere, which is effective for heat dissipation, some measures are usually taken. For Example, heat dissipation fins 101a are provided by, such as folding a metal plate, as shown in a heat sink 101 in FIG. 4C. However, since the heat dissipation fin 101a is not connected with the features of the invention, the following explanation will be given about a heat sink without a heat dissipation fin 101a.

Referring to Fig. 4B, the surfaces 100b adjoining the inside surface 100a of the U-shape, which have been plated with solder, are set by a machine so as to abut the printed wiring board and soldered on the printed wiring board by means of reflow soldering. In this case, electronic parts are previously disposed inside the U-shape.

Figure 5A:
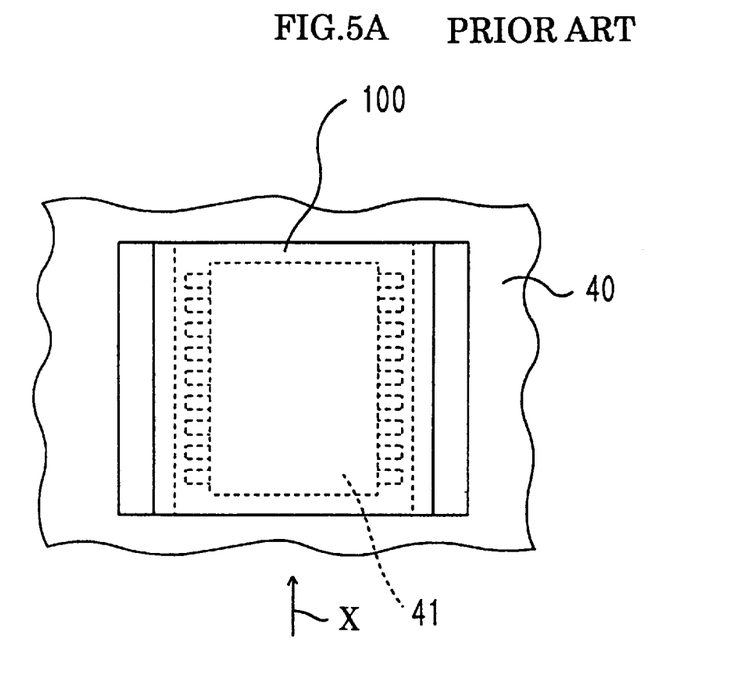
FIGS. 5A and 5B are a plan view and a side view, respectively, showing a conventional heat sink mounted over an electronic part on a printed wiring board.
Figure 5B:
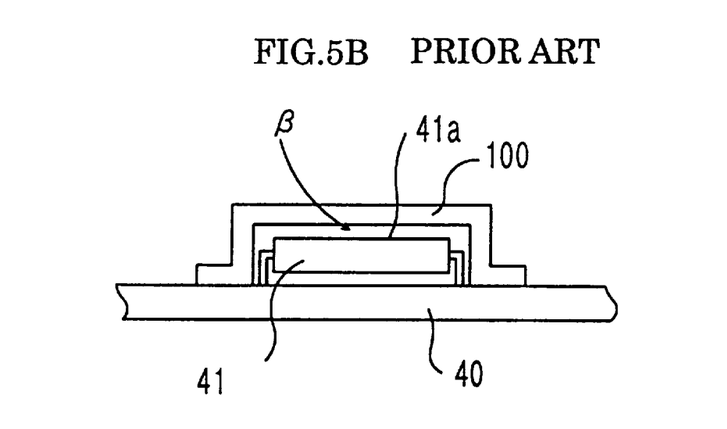

FIGS. 5A and 5B illustrate the heat sink 100 mounted with an electronic part 41 on a printed wiring board 40. FIG. 5A is a plan view and FIG. 5B is a side view taken in the direction of arrow X of FIG. 5A. As shown in FIGS. 5A and 5B, the heat sink 100 is mounted so as to cover the upper surface 41a of the electronic part 41 mounted on the printed wiring board 40.

In order to conduct the heat of the electronic part 41 to the heat sink 100 effectively, the heat sink 100 preferably abuts the electronic part 41, specifically the upper surface 41a of the electronic part 41.

However, on automatic mounting by a machine, it is impossible to mount the electronic part 41 and the heat sink 100 such that they abut each other without fail, because of the tolerance of the electronic part 41 and the heat sink 100. Specifically, there is a possibility that a gap β could occur between the upper surface 41a of the electronic part 41 and the heat sink 100, thereby preventing the heat of the electronic part 41 from being effectively conducted to the heat sink 100.

In one conventional way of solving this problem, a grounding terminal of the electronic part 41 is connected with the heat sink 100 by solder on reflow soldering. However, this occasionally causes short circuit and imperfect contact because of the overflow of the solder and, therefore, is not a good solution.

SUMMARY OF THE INVENTION

The primary purpose of the invention is to solve the above-mentioned problem and to provide a heat sink which can be automatically mounted and can effectively conduct and dissipate heat from an electronic part.

To attain this and other purposes, a heat sink of the invention provided with a heat dissipation plate for conducting and dissipating heat of an electronic part to the outside atmosphere, comprises a phase changing member, which is provided on the heat dissipation plate, is made of a base material having a heat conductive filler dispersed therein, changes its phase when heated from the outside, abuts the electronic part due to the phase change and can connect the electronic part with the heat dissipation plate.

The heat sink of the invention is automatically mounted on a printed wiring board together with the electronic part. The heat dissipation plate of the heat sink conducts the heat of the electronic part and dissipates it to the outside atmosphere by the temperature difference between the outside atmosphere and the heat dissipation plate. Therefore, the heat dissipation plate is made of a material with high heat conductivity such as, for example, a metal and a metal-plated material. The heat sink of the invention may be used either for one electronic part for dissipating the heat of the electronic part or for a plurality of electronic parts for dissipating the heat of the plurality of electronic parts.

The heat sink of the invention is characteristically provided with a phase changing member provided on a heat dissipation plate. The phase changing member changes its phase by heating from the outside and abut an electronic part owing to the phase change. Specifically, the phase changing member is softened by heating from the outside, with a result of increased fluidity, moves by the action of gravity to abut the electronic part and is solidified by cooling. Consequently, the heat dissipation plate is directly connected with the electronic part. "Heating from the outside" is, for example, heating by reflow soldering where soldering is carried out to the electronic part to be surface mounted using an outside heat source. In order to induce the phase change by the heating of reflow soldering, the phase changing member needs to be formed from a material which changes its phase practically at about 100° C. to about 150° C.

Since the phase changing member is formed from a base material having a heat conductive filler dispersed therein, it has high heat conductivity. Therefore, according to the heat sink of the invention, the heat conduction from the electronic part to the heat dissipation plate is accelerated and the heat from the electronic part is effectively dissipated as a consequence.

In the heat sink of the invention, a phase changing member is provided and an electronic part is connected with a heat dissipation plate via the phase changing member in order to accelerate heat conduction from the electronic part to the heat dissipation plate. It is also effective for soldering an electronic part by means of reflow soldering to connect the electronic part and the heat dissipation plate via the phase changing member.

Heretofore, there has been used a kind of heat sink called a sealed package provided with a heat dissipation plate, at least the surface which is made of an electrically conductive material and the shape of which is designed such that it surrounds an electronic part. Such a heat sink is advantageous for shielding electromagnetic waves as well as for heat dissipation of an electronic part.

However, since such a heat sink is mounted so as to over the electronic part, there is a problem that heated air of reflow soldering does not blow against the electronic part so that the electronic part cannot be soldered. Therefore, in order to make automatic setting possible, it is necessary to provide many holes on the heat sink so that the heated air blows against the electronic parts and the electronic part can be soldered. Then, there is another problem that electromagnetic waves pass through the holes and especially those of short wavelength or high frequency cannot be shielded.

In contrast, according to another aspect of the invention, in a heat sink provided with the aforementioned phase changing member, at least the surface of a heat dissipation plate is made of an electrically conductive material and the heat dissipation plate may be formed in such a shape as to cover the electronic part to shield electromagnetic waves.

In this case, as aforementioned, since the heat dissipation plate and the electronic part are connected via the phase changing member owing to the heating by reflow soldering, the heat of reflow soldering is conducted from the heat dissipation plate to the electronic parts via the phase changing member. Specifically, when the heat dissipation plate is heated on soldering by means of reflow soldering, the electronic part is also heated by heat conduction via the phase changing member. Therefore, the possibility becomes high that the electronic part is soldered by the heat supplied via the phase changing member. As a result, by means of the heat dissipation plate whose shape is designed to cover the electronic part so as to shield electromagnetic waves, electromagnetic waves of especially high frequency that is unable to be shielded in a conventional way can be shielded.

As "a shape for covering an electronic part so as to shield electromagnetic waves", it is desirable to close up the electronic part with the heat dissipation plate without any holes thereon, from the viewpoint of shielding electromagnetic waves. However, it is possible that the electronic parts cannot be soldered by only the heat supplied via the phase changing member. In such a case, holes are possibly provided on the heat dissipation plate for supplying heat therethrough. That is, according to a further aspect of the invention, holes may be provided on the heat dissipation plate for supplying heat from the outside to the electronic part. Even in this case, since the heat needed for soldering the electronic part is partly supplied via the phase changing member, it is sufficient to provide only a less number of holes compared with a conventional type. Since the shorter wavelength an electromagnetic wave has, the more easily it passes through holes, the shielding effect against electromagnetic waves of high frequency can be enhanced by decreasing the number of holes.

BRIEF DESCRIPTION OF THE DRAWING FIGURES

The invention will now be described, by way of example, with reference to the accompanying drawings, in which.

DETAILED DESCRIPTION OF THE PREFERRED EMBODIMENTS

Figure 1:
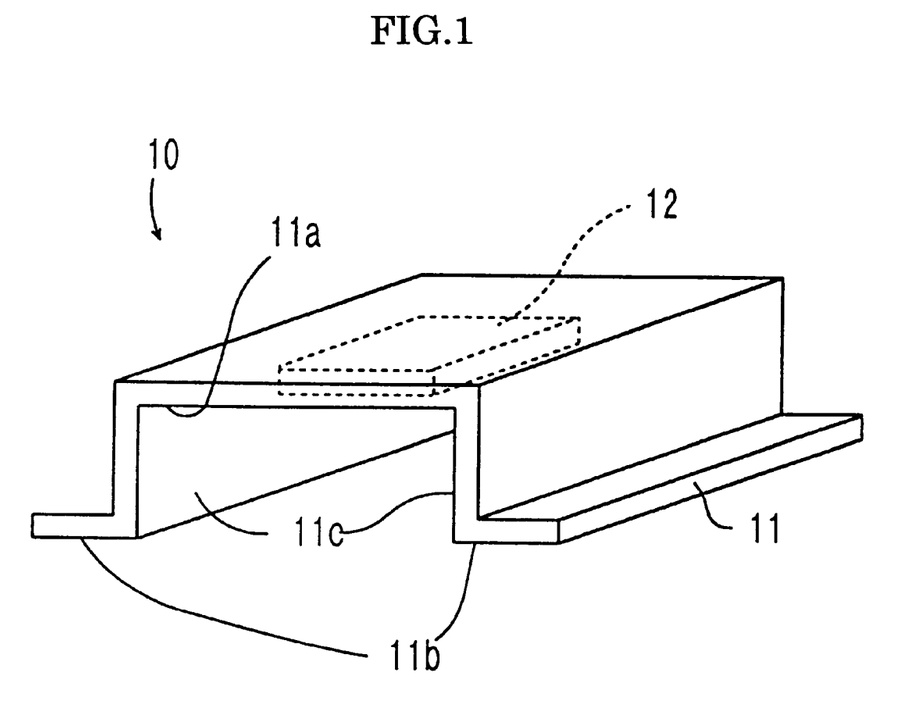
FIG. 1 is a perspective view showing a heat sink according to a first embodiment.

Preferred embodiments of the invention will be described as follows, referring to the drawing figures.
The First Embodiment As shown in FIG. 1, a heat sink 10 of the first embodiment comprises a heat dissipation plate 11 and a phase changing member 12.

The heat dissipation plate 11 is formed by pressing a rectangular metal plate of aluminium, copper or the like so as to be bent along lines perpendicular to its longitudinal direction. Specifically, the metal plate is bent into a U-shaped form in its cross section and both longitudinal end parts of the metal plate are respectively bent perpendicularly toward outside of the U-shape. Surfaces of both end parts bent in right angle, i.e. surfaces 11b continuing from inside surfaces 11c of the U-shape are soldered on a printed wiring board such that a surface 11a and the surface 11c inside the U-shape face to the printed wiring board. The surfaces 11b will be referred to as the joining surfaces 11b hereinafter. The joining surfaces 11b have previously been plated with solder.

A phase changing member 12 is applied, with an adhesive, to the ceiling surface 11a of the heat dissipation plate 11. The phase changing member 12 is made of a mixture of paraffine and an epoxy resin having alumina as a heat conductive filler dispersed therein and is molded into a rectangular plate-like member, with a heat conductivity of not lower than 0.5 W/m·K and a melting point of about 100° C. to 150° C. The phase changing member 12 is of such a size that it fully abuts the upper surface of the electronic part mentioned below to a required extent when it changes its phase.

In the first embodiment, a mixture of paraffine and an epoxy resin is used as a base material of the phase changing member 12. However, a material of elastomeric polystyrene resin such as SEBS, SIS and SEPS, a material of the olefin family such as an ethylene-vinyl acetate copolymer, an ethylene-acrylic ester copolymer, an amorphous PP/ethylene random copolymer and an ethylene-α-olefin copolymer, a material of the polyester family, a material of the polyamide family, an epoxy resin and the like, a mixture of these materials, or a mixture of paraffine and one or more of these materials may be used as a base material. Though in the first embodiment, fine particles of alumina are dispersed as a heat conductive filler, aluminium hydroxide, SiC, beryllium oxide, aluminium nitride, boron nitride and the like are alternative to alumina. A mixture of the substances can be used.

Figure 2A:
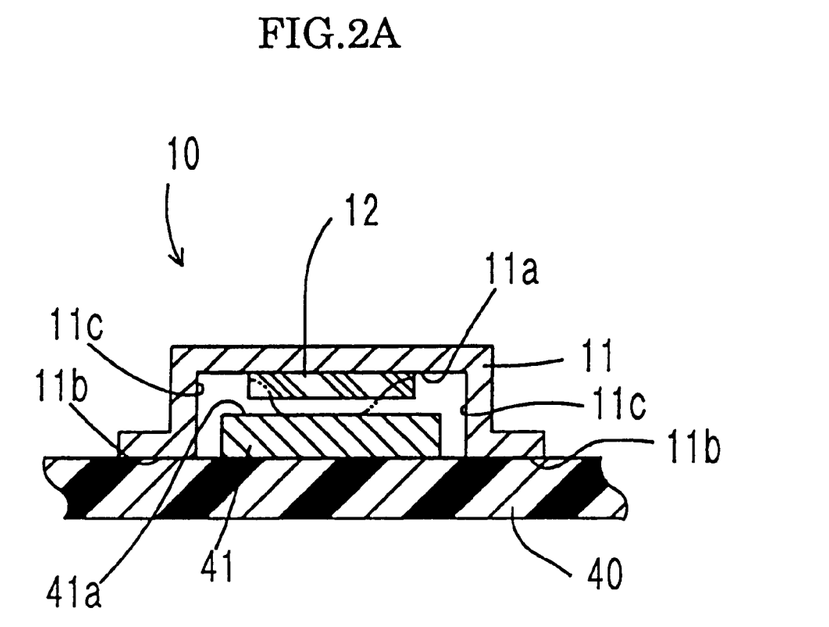
FIGS. 2A and 2B are cross-sectional views of heat sinks for illustrating the function and position of phase changing members.

As shown in FIG. 2A, in the heat sink 10 of the first embodiment, the joining surfaces 11b of the heat dissipation plate 11 are made to abut the printed wiring board 40 and set by a machine in such a way that the electronic part 41 set on the printed wiring board 40 is received in the inside space of the heat dissipation plate 11. Since the joining surfaces 11b have already been plated with solder, they are soldered on the printed wiring board 40 together with the electronic part 41 by means of reflow soldering.

On the ceiling surface 11a of the heat dissipation plate 11, there is provided a phase changing member 12. Specifically, the phase changing member 12 is provided on the ceiling surface 11a of the heat dissipation plate 11 facing the upper surface 41a of the electronic part 41. Therefore, when the heat sink 10 and electronic part 41 are soldered on the printed wiring board 40 by means of reflow soldering, the phase changing member 12 is softened and a part of it moves downward due to gravity, as shown by the two-dot chain line in FIG. 2A, to abut the upper surface 41a of the electronic part 41. Consequently, the heat dissipation plate 11 and the electronic part 41 are connected via the phase changing member 12. The phase changing member 12 has a high heat conductivity, since alumina as a heat conductive filler is dispersed therein.

As mentioned above, according to the heat sink 10 which can be automatically mounted, the heat conduction from the electronic part 41 to the heat dissipation plate 11 is accelerated and as a result, the heat of the electronic part 41 during use can be effectively dissipated.

The Second Embodiment

In the above described first embodiment, the phase changing member 12 having alumina dispersed therein is provided, and the electronic part 41 and the heat dissipation plate 11 are connected with each other via the phase changing member 12 in order to accelerate heat conduction from the electronic part 41 to the heat dissipation plate 11. The invention that the electronic part 41 and the heat dissipation plate 11 are connected with each other via the phase changing member 12 is also effective for soldering of the electronic part 41 by means of reflow soldering.

Specifically, when the heat dissipation plate 11 and the electronic part 41 are connected with each other via the phase changing member 12, the heat of reflow soldering is conducted from the heat dissipation plate 11 to the electronic part 41 via the phase changing member 12. That is, the heat necessary for soldering of the electronic part 41 is conducted via the phase changing member 12.

Therefore, a heat sink of the second embodiment can be proposed as follows.

Figure 3:
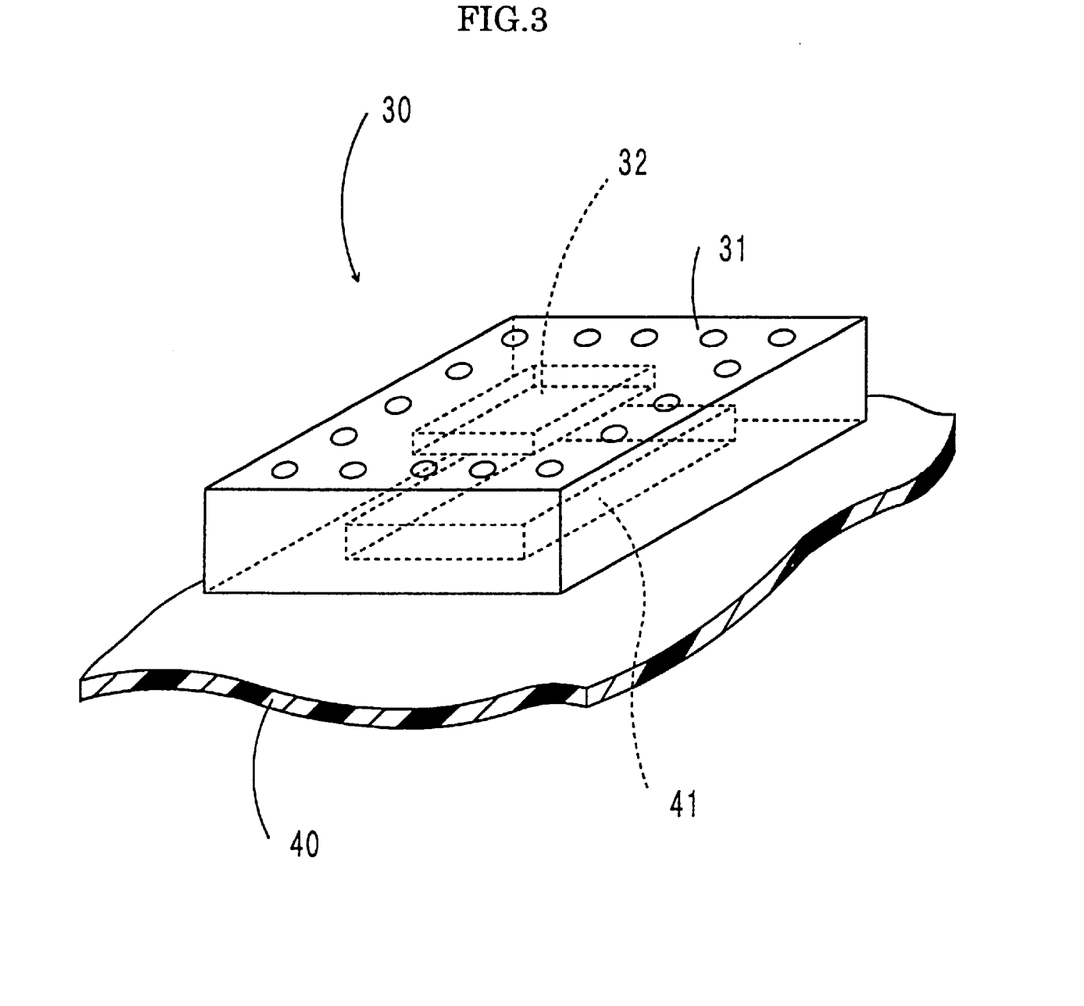
FIG. 3 is a perspective view of a heat sink according to a second embodiment.

FIG. 3 shows a state where the heat sink 30 is set together with the electronic part 41 on a printed wiring board 40. Here, a heat dissipation plate 31 is of a box-like shape or a rectangular parallelepiped whose one face is opened. In FIG. 3, there is shown a state where the heat sink 30 is set on the printed wiring board 40 in such a way that the heat dissipation plate 31 covers the electronic part 41 with its opened face on the printed wiring board 40. Here, the heat dissipation plate 31 is made of aluminium or copper, similar to that of the first embodiment.

A phase changing member 32 similar to that of the first embodiment is applied to a ceiling surface of the heat dissipation plate 31 with an adhesive.

When the heat sink 30 is soldered on the printed wiring board 40 together with the electronic part 41 by means of reflow soldering, the phase changing member 32 changes its phase and abuts the electronic parts set on the printed wiring board 40 to connect the heat dissipation plate with the electronic part 41. Therefore, the heat necessary for soldering of the electric part 41 is conducted via the phase changing member 12.

After having been mounted on the printed wiring board 40 by means of reflow soldering, the heat sink 30 of the second embodiment can dissipate the heat as effectively as the heat sink 10 of the first embodiment from the electronic part 41 during use to the outside atmosphere.

Since the heat dissipation plate 31 is made of a metallic material and mounted so as to cover the electronic part 41, electromagnetic waves can be shielded.

Heretofore, there has been the following problem in automatically mounting a heat sink having a heat dissipation plate formed to cover an electronic part by means of reflow soldering:

Since the heat dissipation plate covers the electronic parts, heated air of reflow soldering does not blow against the electronic part so that the part cannot be soldered. Therefore, in order to make automatic mounting possible, many holes have to be provided on the heat dissipation plate so that the heated air of reflow soldering flows to the electronic parts. As a result, electromagnetic waves pass through the holes and especially those with short wavelength or high frequency cannot be shielded. Contrary to this, in the heat sink 30 of the second embodiment, since the heat dissipation plate 31 is connected with the electronic part 41 by the phase changing member 32 on soldering by means of reflow soldering, the heat of reflow soldering is partly conducted from the heat dissipation plate 31 to the electronic part 41 via the phase changing member 32. That is, when the heat dissipation plate 31 is heated, the electronic part 41 is heated by conducted heat from the phase changing member 32. Therefore, if the electronic part 41 can be soldered by the heat supplied via the phase changing member 32, it is not necessary to provide holes in order for heated air of reflow soldering to flow to the electronic part 41. As a result, electromagnetic waves are surely shielded.

When the electronic part 41 cannot be soldered by only the heat supplied via the phase changing member 32, some holes are formed. Even in this case, the number of holes may be less than that of a conventional heat sink, since heat is supplied via the phase changing member 32 to some extent. As a result, the shield effect against electromagnetic waves, specifically those of high frequency passing through the holes, can be enhanced.

The invention is not limited to the above-mentioned embodiments and can be variously embodied within the scope of the invention.

For example, the shape of the heat dissipation plate and setting position of the phase changing member of the first and second embodiments are not particularly limited. Any shape and setting position are possible if only the electric part and the heat dissipation plate are connected with each other via the phase changing member owing to the phase change thereof. Therefore, the phase changing member may be provided according to shapes and relative positions of the heat dissipation plate and the electronic part such that the phase changing member connects the heat dissipation plate and the electronic part as a consequence of the phase change thereof.

Figure 2B:
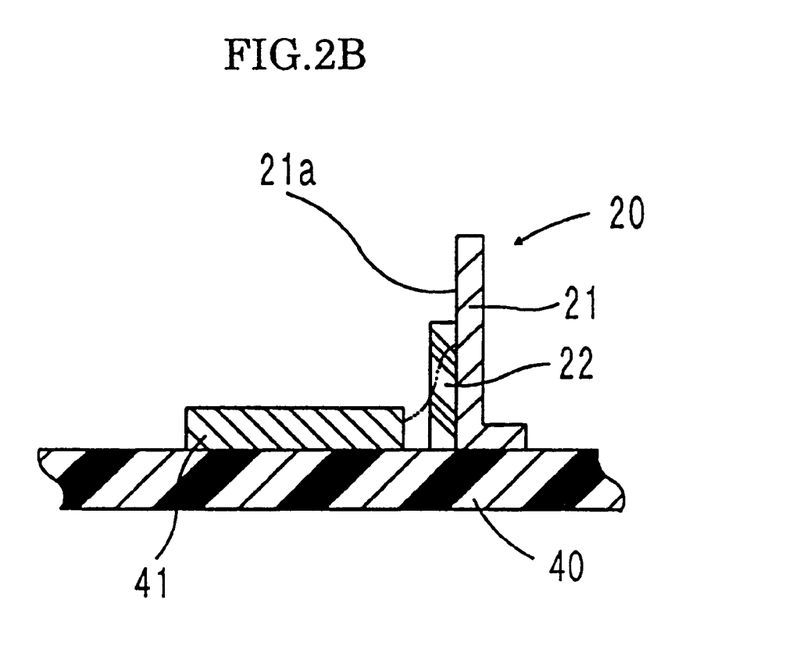

For example, in a heat sink 20 shown in the cross-sectional view of FIG. 2B, since a heat dissipation plate 21 is mounted nearly in perpendicular to the printed wiring board 40 near the electronic part 41, a phase changing member 22 is provided on the side surface 21a of the heat dissipation plate 21 facing to the electronic part 41. In this case, when the phase changing member 22 changes phase, a part of the softened phase changing member 22 moves toward the electronic part 41 due to gravity, as shown by the two-dot chain line in FIG. 2B, to abut the electronic part 41.

Therefore, the heat dissipation plate 21 and the electronic part 41 are connected with each other via the phase changing member 22.

However, from the standpoint of accelerating heat conduction, it is more effective to widen the contact area between the electronic part and the heat dissipation plate. For this purpose, in the heat sink 10 of the first embodiment shown in FIG. 2A, though the phase changing member 12 may be provided on the inside surface 11c of the heat dissipation plate 11 having a U-shaped cross section, it is more desirable to provide the phase changing member 12 on the ceiling surface 11a of the heat dissipation plate 11 in order to widen the contact area.

Though a metal plate of aluminium, copper or the like is used for the heat dissipation plate 11, 31 in the first and second embodiments, a resin and the like plated with metal, for example, may be used. As long as the surface is coated with a conductive material, the heat sink effectively shields electromagnetic waves, as shown in the second embodiment.

What is claimed is:

1. A heat sink for an electronic part, the heat sink comprising:

an electronic part supported by a circuit board;

a heat dissipation plate located on the circuit board adjacent the electronic part for conducting heat to and dissipating heat from the electronic part, the heat dissipation plate being manufactured from an electrically conductive material and the heat dissipation plate being formed so as to cover and shield the electronic part from electromagnetic waves;

a phase changing member being provided on a surface of said heat dissipation plate facing the electronic part, the phase changing member being manufactured from a base material having a heat conductive filler dispersed therein, and the phase changing member changing from an initial solid phase, once subjected to heat from an external source, and the phase changing member flowing into contact with the electronic part to facilitate soldering of the electronic part to the circuit board and couple the heat dissipation plate to the electronic part; and the heat conductive filler being selected from the group consisting of alumina, aluminum hydroxide, SiC, beryllium oxide, aluminum nitride, boron nitride, and a mixture of at least two of alumina, aluminum hydroxide, SiC, beryllium oxide, aluminum nitride and boron nitride.

2. The heat sink according to claim 1, wherein the heat dissipation plate has at least one hole for supplementing a supply of heat to the electronic part to assist with soldering of the electronic part to the circuit board.

3. The heat sink according to claim 1, wherein said base material for said phase changing member is selected from the group consisting of polystyrene resin, an ethylene-vinyl acetate copolymer, an ethylene-acrylic ester copolymer, an amorphous PP/ethylene random copolymer, an ethylene-α-olefin copolymer, a polyester, a polyamide and an epoxy resin.

4. The heat sink according to claim 1, wherein said base material for said phase changing member is selected from the group consisting of a mixture of at least two of the following: polystyrene resin, an ethylene-vinyl acetate copolymer, an ethylene-acrylic ester copolymer, an amorphous PP/ethylene random copolymer, an ethylene-α-olefin copolymer, a polyester, a polyamide and an epoxy resin.

5. The heat sink according to claim 1, wherein said base material for said phase changing member is selected from the group consisting of a mixture of paraffin and of at least one of the following: polystyrene resin, an ethylene-vinyl acetate copolymer, an ethylene-acrylic ester copolymer, an amorphous PP/ethylene random copolymer, an ethylene-α-olefin copolymer, a polyester, a polyamide and an epoxy resin.

6. A heat sink for an electronic part, the heat sink comprising:

an electronic part supported by a circuit board;

a heat dissipation plate located on the circuit board adjacent the electronic part for conducting heat to and dissipating heat from the electronic part, the heat dissipation plate being manufactured from an electrically conductive material and the heat dissipation plate being formed so as to cover and shield the electronic part from electromagnetic waves; and a phase changing member being provided on a surface of said heat dissipation plate facing the electronic part but the phase changing member being initially spaced from the electronic part, the phase changing member being manufactured from a base material having a heat conductive filler dispersed therein, and the phase changing member changing from an initial solid phase, once subjected to heat from an external source, and flowing into contact with the electronic part to facilitate soldering of the electronic part to the circuit board and couple the heat dissipation plate to the electronic part.

7. The heat sink according to claim 6, wherein the heat conductive filler being selected from the group consisting of alumina, aluminum hydroxide, SiC, beryllium oxide, aluminum nitride, boron nitride, and a mixture of at least two of alumina, aluminum hydroxide, SiC, beryllium oxide, aluminum nitride and boron nitride.

8. The heat sink according to claim 6, wherein the heat dissipation plate has at least one hole for supplementing a supply of heat to the electronic part to assist with soldering of the electronic part to the circuit board.

9. The heat sink according to claim 6, wherein said base material for said phase changing member is selected from the group consisting of polystyrene resin, an ethylene-vinyl acetate copolymer, an ethylene-acrylic ester copolymer, an amorphous PP/ethylene random copolymer, an ethylene-α-olefin copolymer, a polyester, a polyamide and an epoxy resin.

10. The heat sink according to claim 6, wherein said base material for said phase changing member is selected from the group consisting of a mixture of at least two of the following: polystyrene resin, an ethylene-vinyl acetate copolymer, an ethylene-acrylic ester copolymer, an amorphous PP/ethylene random copolymer, an ethylene-α-olefin copolymer, a polyester, a polyamide and an epoxy resin.

11. The heat sink according to claim 6, wherein said base material for said phase changing member is selected from the group consisting of a mixture of paraffin and of at least one of the following: polystyrene resin, an ethylene-vinyl acetate copolymer, an ethylene-acrylic ester copolymer, an amorphous PP/ethylene random copolymer, an ethylene-α-olefin copolymer, a polyester, a polyamide and an epoxy resin.

12. A method of manufacturing a heat sink for an electronic part, the method comprising the steps of:

supporting an electronic part on a circuit board;

locating a heat dissipation plate on the circuit board adjacent the electronic part for conducting heat to and dissipating heat from the electronic part, the heat dissipation plate being manufactured from an electrically conductive material and the heat dissipation plate being formed so as to cover and shield the electronic part from electromagnetic waves; and providing a phase changing member on a surface of said heat dissipation plate facing the electronic part but the phase changing member being initially spaced from the electronic part, and the phase changing member being manufactured from a base material having a heat conductive filler dispersed therein; and subjecting the phase changing member to heat from an external source to change the phase changing member from an initial solid phase to a phase which facilitates flowing of the phase changing member into contact with the electronic part to facilitate soldering of the electronic part to the circuit board and couple the heat dissipation plate to the electronic part.

* * * * *